(12) United States Patent
Hoshiya et al.

(10) Patent No.: US 7,456,758 B2
(45) Date of Patent: Nov. 25, 2008

(54) MAGNETIC ENCODER APPARATUS

(75) Inventors: Hiroyuki Hoshiya, Odawara (JP); Kenichi Meguro, Kaisei (JP); Kazuhiro Nakamoto, Ninomiya (JP); Yasunori Abe, Moka (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 11/676,608

(22) Filed: Feb. 20, 2007

(65) Prior Publication Data

US 2008/0068007 A1 Mar. 20, 2008

(30) Foreign Application Priority Data

Sep. 19, 2006 (JP) ............................... 2006-252928

(51) Int. Cl.
*H03M 1/22* (2006.01)

(52) U.S. Cl. ........................................................ 341/15

(58) Field of Classification Search ................... 341/15, 341/6; 318/560; 360/324.2, 319, 321; 365/171
See application file for complete search history.

(56) References Cited

U.S. PATENT DOCUMENTS

| | | | | |
|---|---|---|---|---|
| 5,172,057 A | * | 12/1992 | Yoshimura et al. | 324/207.21 |
| 5,408,377 A | | 4/1995 | Gurney et al. | |
| 5,545,958 A | * | 8/1996 | Kramer | 318/560 |
| 6,351,119 B1 | * | 2/2002 | Kawase | 324/249 |
| 6,374,058 B2 | * | 4/2002 | Sasaki et al. | 396/319 |
| 6,385,082 B1 | * | 5/2002 | Abraham et al. | 365/171 |
| 6,692,847 B2 | * | 2/2004 | Shirasaki et al. | 428/811.3 |
| 6,961,222 B2 | * | 11/2005 | Kishi | 360/321 |
| 7,114,237 B2 | * | 10/2006 | Chiu et al. | 29/602.1 |
| 7,199,985 B1 | * | 4/2007 | Sato et al. | 360/324.2 |
| 2006/0012922 A1 | | 1/2006 | Shigeru | |
| 2006/0126229 A1 | * | 6/2006 | Grimm et al. | 360/319 |

FOREIGN PATENT DOCUMENTS

| | | |
|---|---|---|
| JP | 61-104304 | 7/1986 |
| JP | 02-120615 | 5/1990 |
| JP | 08-226960 | 9/1996 |
| JP | 11-163439 | 6/1999 |
| JP | 2001-124554 | 5/2001 |
| JP | 2003-106866 | 4/2003 |
| JP | 2005-302131 | 10/2005 |
| JP | 2006-023179 | 1/2006 |
| JP | 2006-029900 | 2/2006 |

* cited by examiner

*Primary Examiner*—Peguy JeanPierre
(74) *Attorney, Agent, or Firm*—Antonelli, Terry, Stout & Kraus, LLP.

(57) ABSTRACT

To provide a magnetic encoder having high resolution and a high output, and a magnetoresistive sensor for an encoder. A fine sensor having a reduced demagnetization field is produced by: forming a free layer consists of a laminated soft magnetic film in which two soft magnetic layers are coupled in anti-parallel, and setting the width of a sensor unit to 2 μm to 4 μm.

7 Claims, 12 Drawing Sheets

MAGNETIC ENCODER APPARATUS

CLAIM OF PRIORITY

The present application claims priority from Japanese application JP 2006-252928 filed on Sep. 19, 2006, the content of which is hereby incorporated by reference into this application.

BACKGROUND OF THE INVENTION

1. Field of the Invention

The present invention relates to a magnetic encoder using a magnetoresistive sensor which reduces a demagnetization field and which has a narrow width.

2. Description of the Prior Art

A magnetic encoder is used as a technology for measuring the position of a driver and the rotation number thereof by using a magnetoresistive sensor and the like. As a magnetoresistive film used for a magnetic sensor part, there are known a magnetic thin film having an anisotropic magnetoresistance, a so-called giant magnetoresistive film which is a multilayered film formed by stacking ferromagnetic metal layers with a nonmagnetic metal layer interposed between each pair thereof, a tunneling magnetoresistive film and the like. There is a spin-valve film as a technology similar to that used for a reproduction sensor of a magnetic head, and it is known as technology with which a giant magnetoresistance is obtained with high sensitivity.

Patent Document 1: U.S. Pat. No. 5,408,377
Patent Document 2: JP Patent No. 3017061
Patent Document 3: JP Patent Publication (Kokai) No. 2003-106866 A
Patent Document 4: JP Patent Publication (Kokai) No. 2006-023179 A

SUMMARY OF THE INVENTION

Although sensors utilizing a magnetoresistance have been studied for encoders, conventional techniques have a difficulty in achieving higher resolution which has been recently required for encoders. In a conventional magnetic encoder, a drawback in achieving high resolution with a magnetoresistive sensor is that a shape anisotropy becomes large. In general, a magnetoresistive sensor for a encoder is formed by disposing one or more sensor units so that the sensor units face a magnetic medium. Each sensor unit is patterned so that it has a band-like long portion having a narrow width. A first a reason for this is that a space occupied by the sensor unit in that direction is set to be small by making the width of the portion narrow, so that spatial resolution in a magnetic field to be detected is increased. A second reason therefor is that, an electric resistance of the entire sensor is increased by allowing electricity to flow in a longitudinal direction, so that current is decreased to a low level, thereby, saving electric power consumption.

For example, when a magnetic pitch (the length of one N or one S) for an encoder is set to be 20 μm, the width of a sensor unit becomes narrower than that. Suppose that a circuit is formed by disposing, for example, two sensors in one pitch in order to take out a magnetic signal in an appropriate form as an electric signal. In this case, the width of one sensor of approximately 5 μm is necessary to maintain an interval between the two sensor units which are the most proximate to each other in the pitch. The width of approximately 5 μm is obtained by dividing 20 μm by 4, from a geometrical point of view. In the same manner, to set the pitch to be 10 μm, it is necessary to set the width of one sensor to be approximately 2.5 μm. Although it is possible to form a sensor by disposing not two but only one sensor unit in one pitch, the larger the width of the sensor unit, the more decreased is the spatial resolution in a magnetic field of the sensor unit. Making the width of a sensor unit narrower produces advantages that the sensor unit has higher spatial resolution, and that it is possible to make wider use of sensor units in various combinations. On the other hand, the length of the sensor is set to be relatively long but within a range that is smaller than the width of a magnetic cord of the encoders, approximately several hundred micrometers, for suppressing electric power consumption.

Consequently, on a magnetic film which constitutes a magnetoresistive sensor, a shape anisotropy occurs along its longitudinal direction which is an easy axis direction. The magnitude of this shape anisotropy is proportional to the thickness of a magnetic film as well as the magnitude of saturation magnetization of the magnetic film which responds to a magnetic field to be sensed. The magnitude of this shape anisotropy is approximately inversely proportional to the width of the sensor. Accordingly, when the magnetoresistive sensor is made to have a narrow width for producing an encoder with high resolution, a large uni-axial anisotropy occurs, which is referred to as a demagnetization field. Consequently, an operation of the magnetoresistive sensor is deviated from a desired magnetic response. To prevent such a shape anisotropy from increasing, the following is considered: to make the thickness of a magnetic film of the magnetoresistive sensor extremely thin, or to decrease saturation magnetization thereof. In any case, however, since a reduction of magnetoresistance occurs, it is heretofore not possible to satisfy all of a high output, high resolution and a desired magnetic field response behavior.

An object of the present invention is to provide a magnetoresistive sensor and an encoder using the sensor, which are capable of achieving a high magnetoresistance, high resolution and a magnetic field response behavior suitable for a magnetic sensor.

In the present invention, as means for solving the above-described problems, a magnetoresistive sensor, having a reduced demagnetization field, is processed so as to have a narrow width, and it is used for a sensor for an encoder. As specific means for reducing a demagnetization field, a magnetoresistive sensor is formed of a spin-valve type GMR film, and a soft magnetic free layer is formed of a synthetic ferrimagnet type layered stack in which layers are stacked so that their magnetization is coupled in anti-parallel. To be more precise, the soft magnetic free layer is formed of a laminated film in which a first soft magnetic film, an anti-parallel coupling film and a second soft magnetic film are stacked in this order from the side of a non-magnetic intermediate layer; the first soft magnetic film and the second soft magnetic film are magnetically coupled to each other in anti-parallel directions; and the following equations are to be satisfied:

$$M1 > M2$$

1 (nanometer Tesla (abbreviated as nm·T))<M−1M2<3 (nm·T), where assuming that M1 denotes the amount of magnetization of the first soft magnetic film, i.e. a product of saturation magnetism and the thickness, and M2 denotes the amount of magnetization of the second soft magnetic film With the above-described method, a magnetic sensor for an encoder having high resolution and high magnetoresistance can be realized.

DESCRIPTION OF THE PREFERRED EMBODIMENTS

A thin film, which is included in a giant magnetoresistive laminated film of a magnetic sensor of a magnetic encoder of the present invention, was made in the following manner by using a DC magnetron sputtering apparatus. In an atmosphere of argon of 0.027 to 0.40 (Pa) [0.2 to 3 (mTorr)], the thin film was made by laminating the following materials in order on a ceramics substrate. As sputtering targets, the following substances were used: tantalum (Ta), nickel-iron-chromium (NiFeCr) alloy, nickel-iron (NiFe) alloy, copper (Cu), cobalt-iron (CoFe) alloy, manganese platinum (MnPt) alloy, and ruthenium (Ru). In the forming of the laminated film, a DC power was applied to cathodes on which respective targets were disposed, whereby plasma was caused to occur in the device. Thereafter, layers were formed in order by opening and closing shutters one by one which were disposed on the respective cathodes. Thus, the laminated film was formed.

At the time of forming the film, a magnetic field of approximately 6.37 (KA/m) [80 (Oe)] was applied in parallel to the substrate by using a permanent magnet, and thereby an induced anisotropy was given thereto. In vacuum and in a magnetic field, the formed film was annealed at 270 degrees Celsius for three hours, whereby the phase of an MnPt antiferromagnetic film was transformed. With this thermal treatment, an easy axis direction of the induced anisotropy of a soft magnetic free layer becomes parallel to a magnetizing direction of magnetization of a ferromagnetic pinned layer. In order to change the induced anisotropy of the soft magnetic free layer 90 degrees from this direction, the thermal treatment of 250 degrees Celsius for three hours was performed in a magnetic field in a direction which was perpendicular to a magnetic field of an initial annealing. In forming an element on a substrate, patterning was performed in a photo-lithography process.

Figure 1:
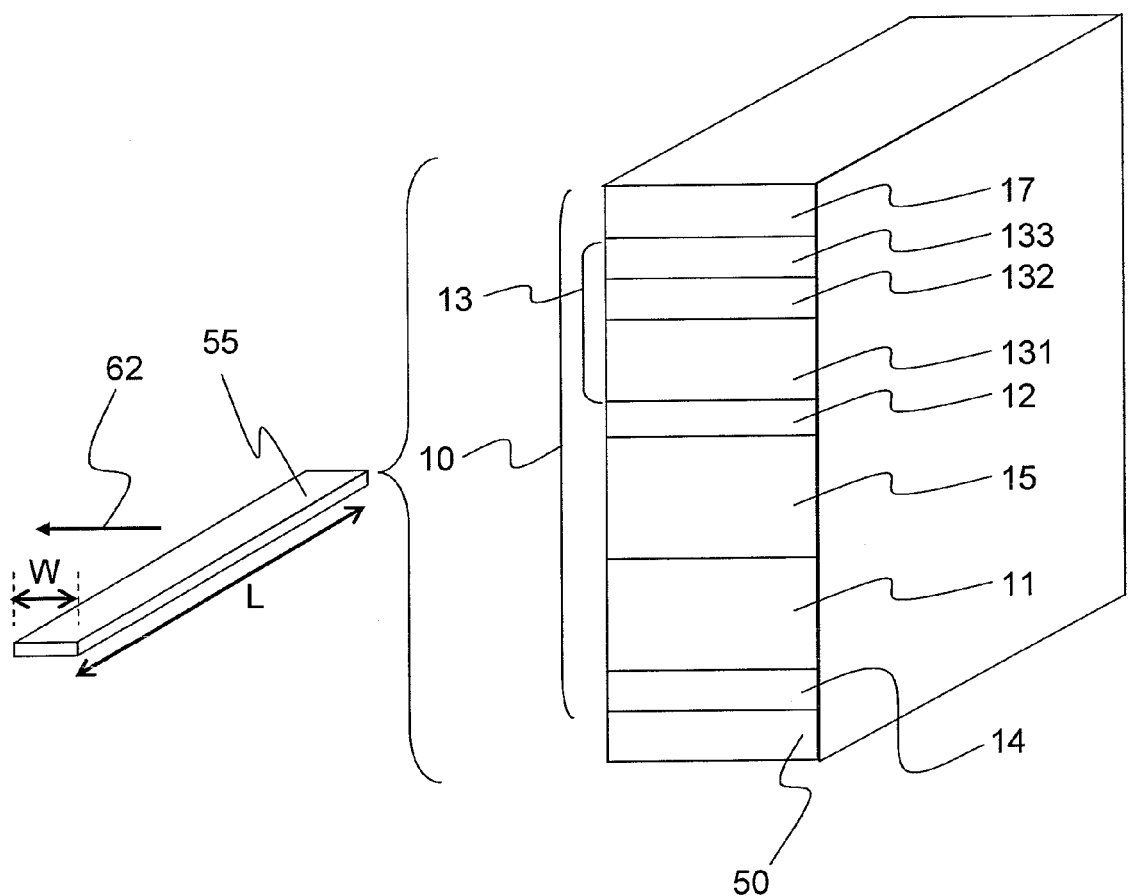
FIG. 1 is a view for showing a structure of a sensor unit of a typical magnetoresistive type reproduction sensor of a magnetic encoder of the present invention.

FIG. 1 shows a structure of a typical magnetoresistive type reproduction sensor of the present invention. A sensor unit 55 includes a magnetoresistive laminated film 10, which is patterned into a strip-like shape, having a width W and a length L. The length L is geometrically sufficiently long compared with the width W, and for the width W, 2 μm to 4 μm, the length L is several times longer than that. To be more precise, it is desired that the length L be 50 μm or longer. On a substrate 50, an underlayer 14, an antiferromagnetic film 11, a ferromagnetic pinned layer 15, a non-magnetic intermediate layer 12, a soft magnetic free layer 13 and a protective layer 17 are formed so that a magnetoresistive laminated film 10 is formed. The antiferromagnetic film 11 causes an exchange coupling force which substantially pins a magnetization direction of the ferromagnetic pinned layer 15 in a magnetization pinned direction 62. The soft magnetic free layer 13 includes a first soft magnetic film 131, an anti-parallel coupling layer 132, and a second soft magnetic film 133. The soft magnetic free layer 13 is a so-called synthetic ferri-magnet free layer. Specifically, the first soft magnetic film 131 and the second soft magnetic film 133 are magnetically coupled to each other with each other's magnetizations being anti-parallel and with the anti-parallel coupling layer 132 interposed therebetween. With the function of this anti-parallel coupling, an operation can be performed so that a substantial amount of magnetization of the soft magnetic free layer 13 corresponds to a difference between amounts of magnetization of the first soft magnetic film 131 and the second soft magnetic film 133. For example, when the amount of magnetization of the first soft magnetic film 131 is 4 (nm·T) (nanometer Tesla), which is a product of the magnetization and a thickness, and when the amount of magnetization of the second soft magnetic film 133 is 2 (nm·T), a substantial amount of magnetization of the soft magnetic free layer 13 can be set to 4−2=2(nm·T). A further description is given by using a drawing of an example of a detailed structure. Incidentally, in the following, a conventional constitution in which a conventional non-synthetic ferri-magnet type soft magnetic free layer is used, was also made for comparison with a constitution in which a synthetic ferri-magnet type soft magnetic free layer of the present invention is used. This non-synthetic ferri-magnet type soft magnetic free layer is, hereinafter, referred to as a "single type."

Figure 2:
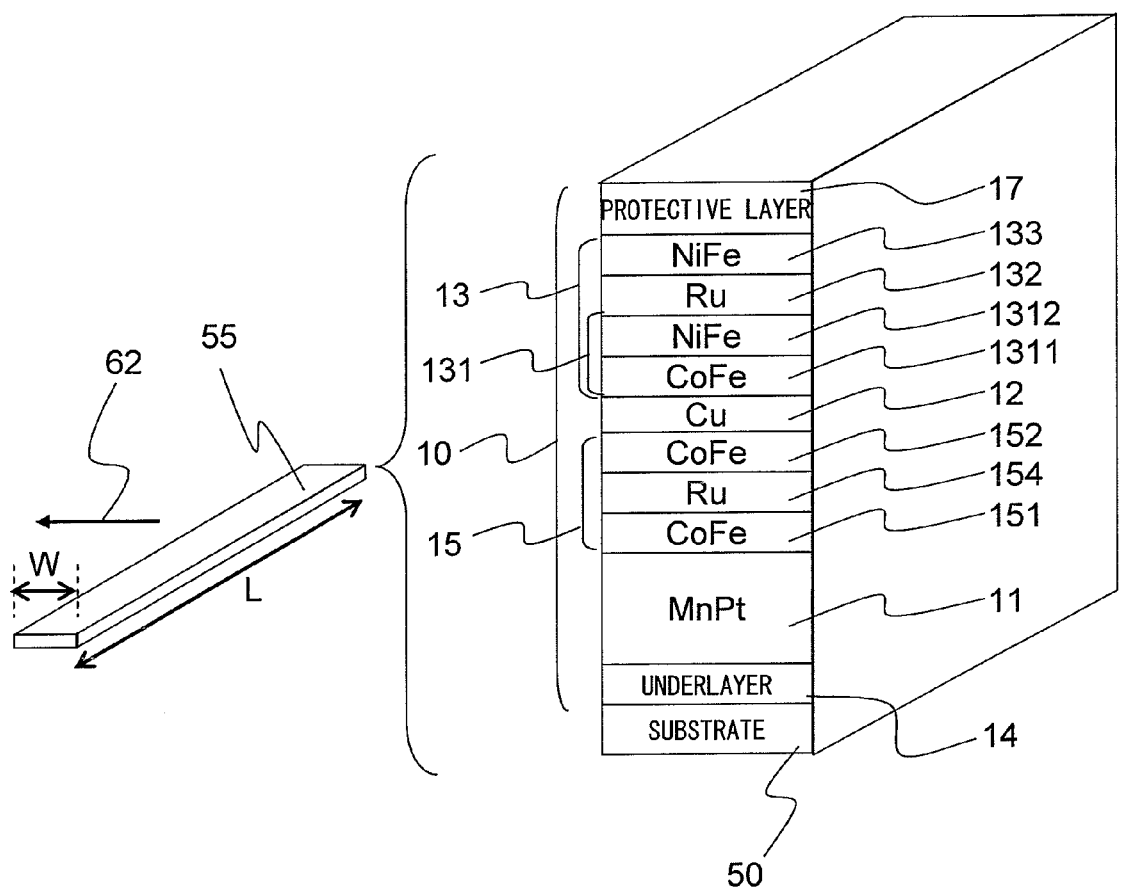
FIG. 2 is a view for showing a detailed structure of the sensor unit of a typical magnetoresistive type reproduction sensor of a magnetic encoder of the present invention.

FIG. 2 shows an example of a detailed structure of a typical magnetoresistive type reproduction sensor of the present invention. A sensor unit 55, a magnetoresistive laminated film 10, a substrate 50, an underlayer 14, an antiferromagnetic film 11, a ferromagnetic pinned layer 15, a non-magnetic intermediate layer 12, a soft magnetic free layer 13, a first soft magnetic film 131, an anti-parallel coupling layer 132, a second soft magnetic film 133, and a protective layer 17 have the same constitutions and functions as those shown in FIG. 1. The ferromagnetic pinned layer 15 is formed by stacking a first ferromagnetic film 151, an anti-parallel coupling layer 154, and a second ferromagnetic film 152. The first ferromagnetic film 151 is magnetically coupled to the second ferromagnetic film 152 with each other's magnetizations being anti-parallel and with the anti-parallel coupling layer 154 interposed therebetween. This constitution is a so-called synthetic ferri-magnet structure. This structure is favorable since it produces effects that a magnetic stability of the ferromagnetic pinned layer 15 is enhanced, that an amount of magnetic field leaking from the ferromagnetic pinned layer 15 to an end of a side surface of the sensor unit 55 is reduced and that a magnetic stability of the soft magnetic free layer 13 is enhanced. Although the first soft magnetic film 131 includes a first soft magnetic layer 1311 and a second soft magnetic layer 1312, the first soft magnetic layer 1311 and the second soft magnetic layer 1312 are strongly coupled to each other with each other's magnetizations so that they function as a single soft magnetic integrated film. The reason why the first soft magnetic film 131 is set to have a laminated stack including the first soft magnetic layer 1311 and the second soft magnetic layer 1312 is that it produces an effect that a magnetoresistance is increased. FIG. 2 shows a specific example of layers forming the magnetoresistive laminated film 10. For the antiferromagnetic film 11, the first ferromagnetic film 151, the anti-parallel coupling layer 154, the second ferromagnetic film 152, the non-magnetic intermediate layer 12, the first soft magnetic layer 1311, the second soft magnetic layer 1312, the anti-parallel coupling layer 132 and the second soft magnetic film 133, MnPt, CoFe, Ru, CoFe, Cu, CoFe, NiFe, Ru and NiFe are respectively used so that a high output and favorable magnetic characteristics can be provided.

Figure 3:
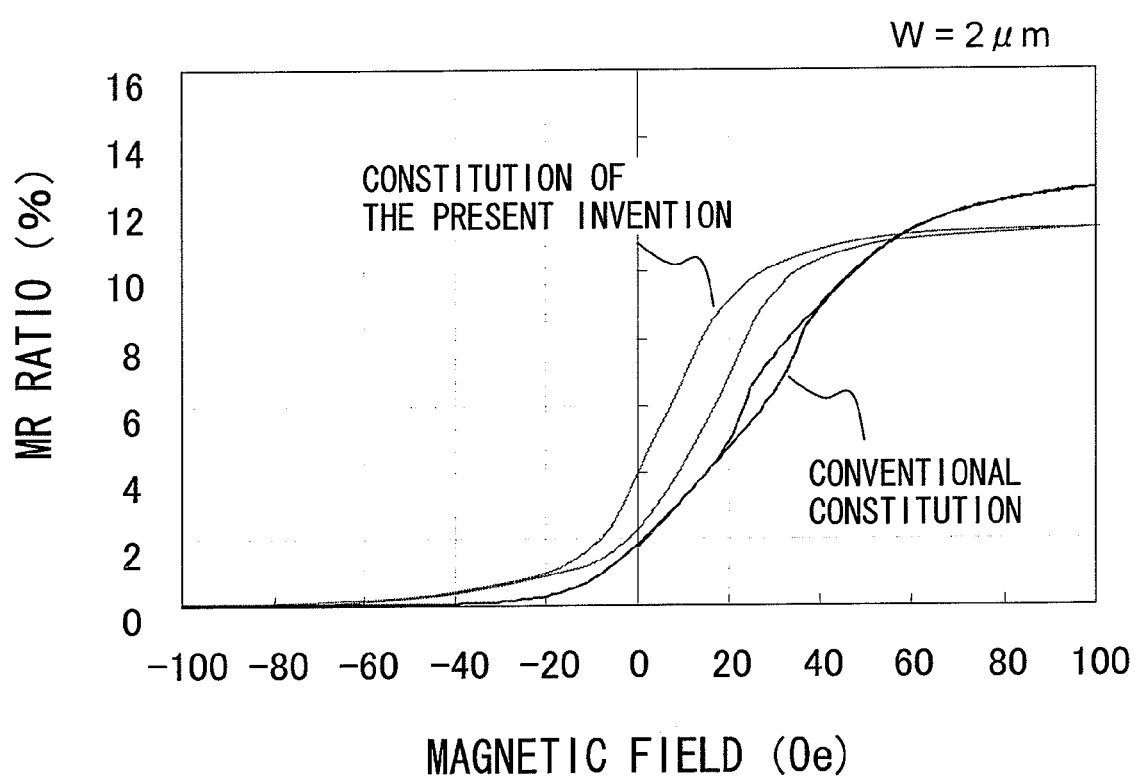
FIG. 3 is a view for showing an example of magnetic field response curves of sensor units of the present invention and a conventional technique.

FIG. 3 shows a magnetic field response curve of a sensor unit of the present invention. For comparison, a magnetic field response curve of a sensor unit having a conventional structure of a usual single type free layer is also shown. In this respect, a constitution of the single type free layer is CoFe (1 nm)/NiFe (3 nm), from a side contacting with a non-magnetic intermediate layer. An amount of magnetization of the layer is approximately 4 (nm·T). Furthermore, a constitution of a free layer of the present invention was similarly set to be CoFe (1 nm)/NiFe (3 nm)/Ru (0.8 nm)/NiFe (2 nm). An amount of magnetization in the case of present invention is approximately 2 (nm·T). For both cases, the width W was 2 μm, and the length L was 100 μm. It can be seen that a magnetic field response curve of the sensor unit of the present invention has high sensitivities in MR ratios (magnetoresistance ratios) to the magnetic field compared with that of the conventional structure. For example, it can be seen when the magnetic field is 3.18 (KA/m) [40 (Oe)], an MR ratio of the conventional sensor is approximately 9% and not saturated yet, while that of the sensor of the present invention is 10% or more.

Figure 4:
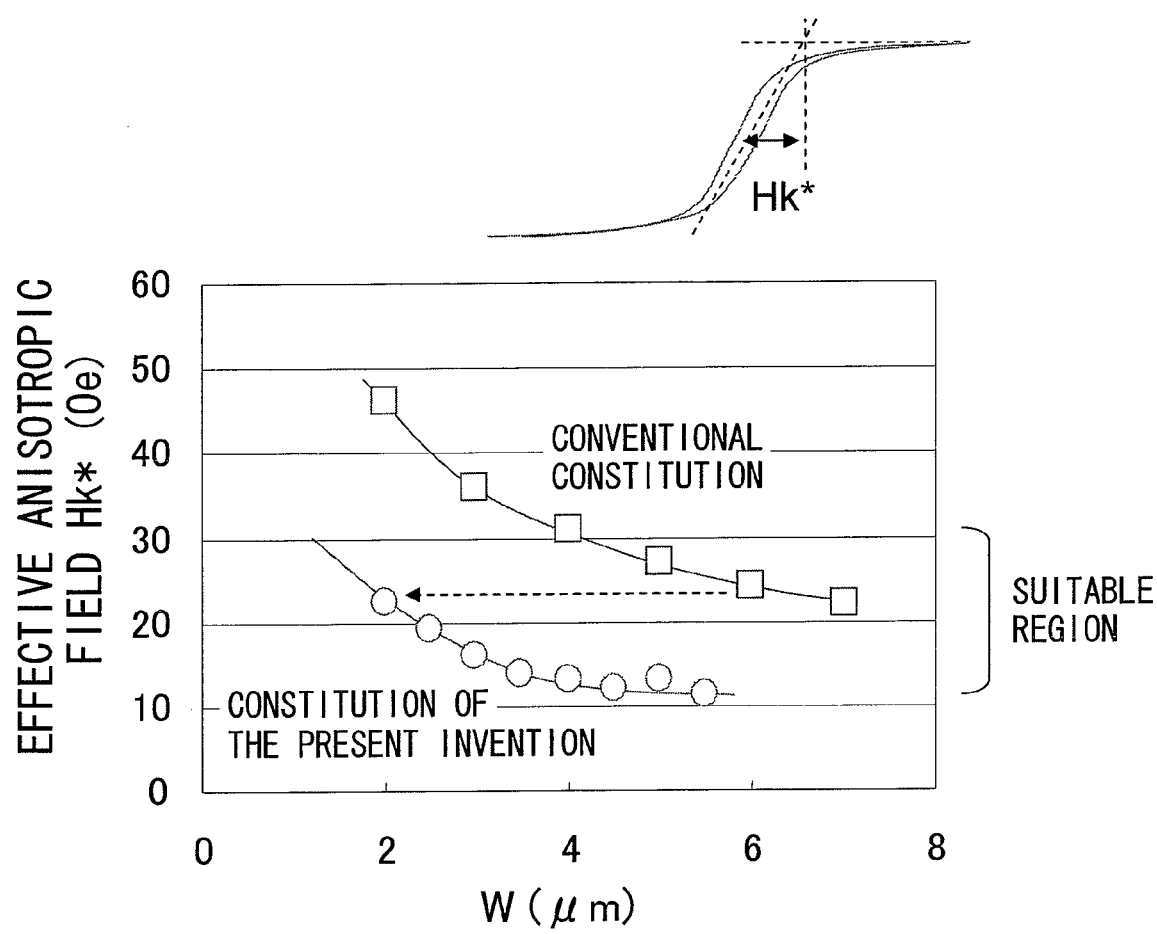
FIG. 4 is a view for showing an effective anisotropic magnetic field Hk* of the sensor units of the present invention and a conventional technique.

As an index of the magnitude of a magnetic field required for saturation, an effective anisotropic magnetic field Hk* is defined as shown on an upper part of FIG. 4. The reason why it is referred to as "effective" is that this Hk* is a value, which is derived from a summation of factors such as an induced anisotropy and a shape anisotropy of a thin film included in a sensor unit, and which is an index for treating their physical contents as a sum without discriminating them.

FIG. 4 shows, on a lower part thereof, the effective anisotropic magnetic field Hk* for the sensor unit of the present invention and that of a conventional technique. The effective anisotropic magnetic field Hk* changes inversely to the width W of the sensor units. In the conventional technique, when the width W narrows to 4 μm, for example, Hk* becomes such that Hk*>2.39 (KA/m) [30 (Oe)]. Specifically, for the sensor unit of the conventional technique, when a sensor having a narrow width W is made, an output is significantly reduced when a magnetic field to be sensed is small. This means that no output is obtained when a gap spacing between a sensor for an encoder and a magnetic medium is large. Meanwhile, in the present invention, the effective anisotropic magnetic field Hk* is small in comparison to that of the conventional constitution, and it is about half thereof. Consequently, when the width W of the sensor unit is 2 μm, a magnitude of the effective anisotropic magnetic field Hk* is 1.75 (KA/m) [22 (Oe)]. This value is equal to that obtained by the sensor unit of the conventional constitution when the width W thereof is 6 μm. It can be seen that, when the constitution of the present invention is used, a narrow sensor unit having a width of 2 μm can obtain the same level of magnetic sensitivity as that of the conventional constitution. When the width W of the sensor unit having the constitution of the present invention is narrower than 6 μm, the effective anisotropic magnetic field Hk* is maintained to be not less than 0.80 (KA/m) [10 (Oe)]. When the effective anisotropic magnetic field Hk* becomes less than 0.80 (KA/m) [10 (Oe)], the sensor unit becomes easily saturated when a gap between the sensor unit and a magnetic medium is small.

As shown in FIG. 4, from the viewpoint of an experiment, a suitable region for an optimum gap spacing dependency was in a range of the effective anisotropic magnetic field Hk* from 0.80 to 2.39 (KA/m) [10 to 30 (Oe)]. A possible reason is considered as follows. In a sensor unit, a magnetic field from a magnetic medium to be sensed induces a magnetoresistance. When the value of the anisotropic magnetic field Hk* becomes 2.39 (KA/m) [30 (Oe)] or greater, the level of the magnetoresistance thus induced becomes smaller than or equal to a threshold. Consequently, a function as a magnetic sensor no longer sufficiently works. Hence, it is understood that a preferable constitution of the present invention is capable of maintaining capability thereof high even when the width W of the sensor unit is so narrow that it is less than 6 μm, especially even when it is in a range of narrower width from 2 μm to 4 μm.

Figure 5:
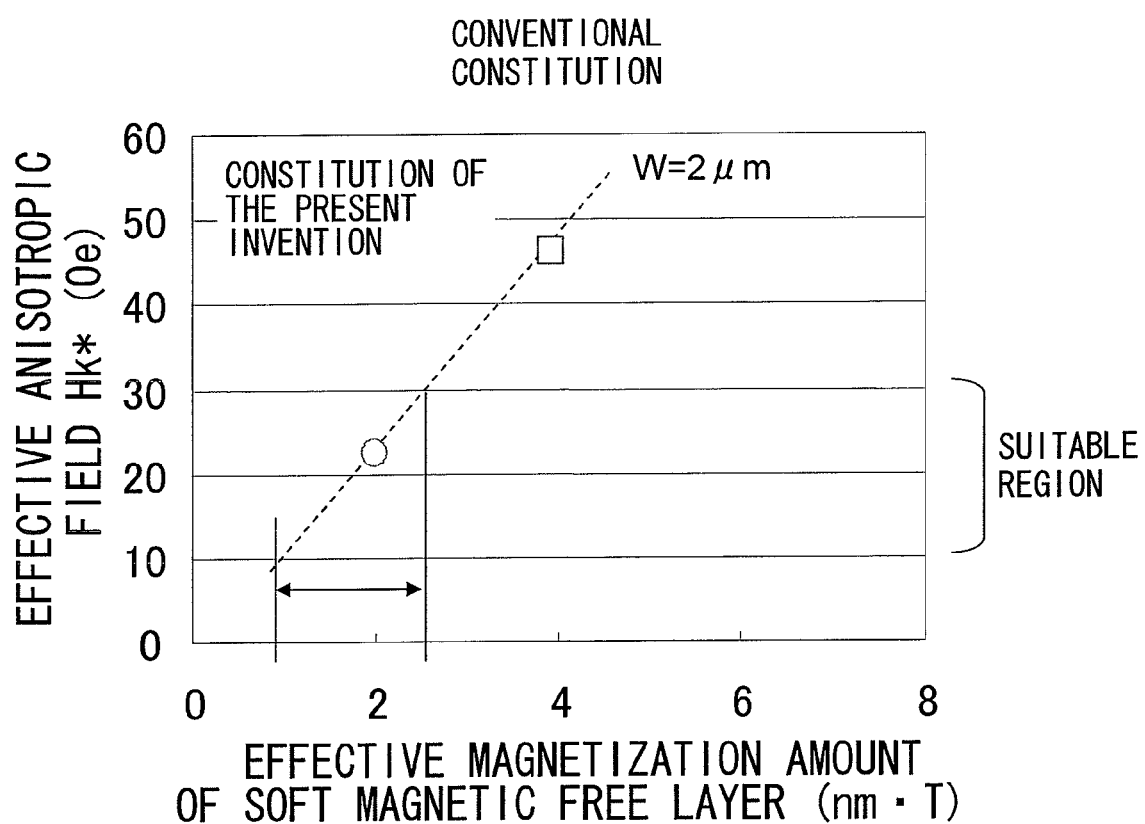
FIG. 5 is a view for showing a relationship between the effective anisotropic magnetic field Hk* and effective amount of magnetization of a soft magnetic free layer of the sensor units of the present invention and a conventional technique.

FIG. 5 shows a relationship between effective anisotropic magnetic field Hk* and effective amount of magnetization of soft magnetic free layer. In the constitution of the present invention, the synthetic ferri-magnet structure such as one shown in FIG. 1 or FIG. 2 causes an effective amount of magnetization of a soft magnetic free layer to be approximately 2 (nm·T) which is small compared with that of a conventional structure. It can be seen that, when the width W of the sensor unit is constant, the magnitude of the effective anisotropic magnetic field Hk* is proportional to an effective amount of magnetization of a soft magnetic free layer. Furthermore, in order to obtain a suitable gap spacing dependency using the sensor having a width W of 2 μm, the effective anisotropic magnetic field Hk* is needed to be set to a suitable value in a range of 0.80 to 2.39 (KA/m) [10 to 30 (Oe)]. For this purpose, it can be seen that it is necessary to set the effective amount of magnetization of a soft magnetic free layer to be in a range of approximately 1 (nm·T) to 3 (nm·T).

Figure 6:
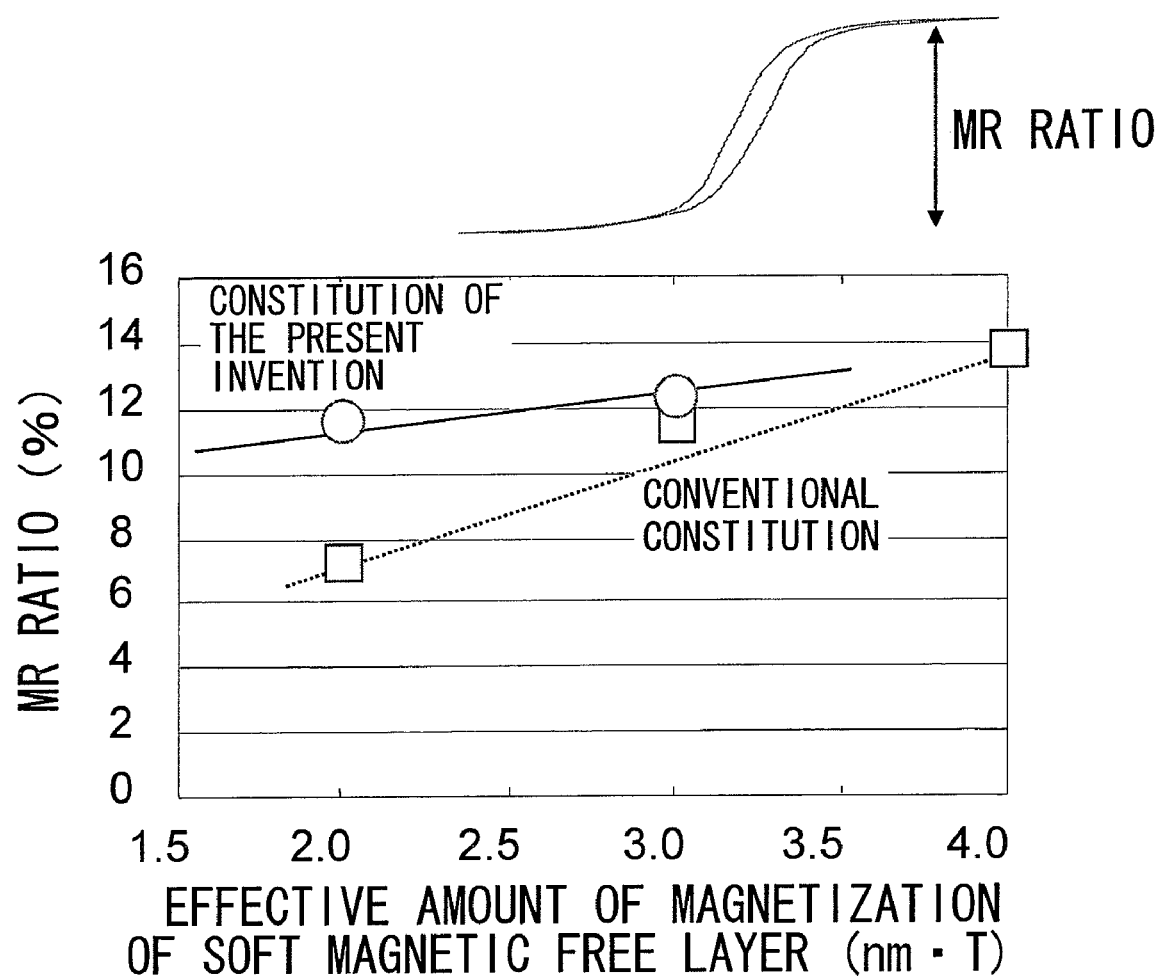
FIG. 6 is a view for showing a relationship between an MR ratio and the effective amount of magnetization of a soft magnetic free layer of the sensor units of the present invention and a conventional technique.

FIG. 6 shows a relationship between MR ratios of sensor units of the present invention and a conventional structure, and effective amounts of magnetization of soft magnetic free layer thereof. In the conventional constitution having a single type free layer, to reduce an effective amount of magnetization of a soft magnetic free layer, it is necessary to reduce the thickness of the soft magnetic free layer. In an example of the conventional constitution of FIG. 6, the constitution of CoFe (0.5 nm to 1 nm)/NiFe (1 nm to 2 nm) was used. To be more precise, when the effective amount of magnetization of a soft magnetic free layer was 4 (nm·T), the constitution of CoFe (1 nm)/NiFe (2 nm) was used. Similarly, when it was 2 (nm·T), the constitution of CoFe (0.5 nm)/NiFe (1 nm) was used. It can be seen that, in the case of the sensor unit of the conventional structure, a reduction in the effective amount of magnetization of a soft magnetic free layer causes a drastic reduction in an MR ratio. When the effective amount of magnetization is reduced to 2 (nm·T), an output of the sensor is reduced to a large extent. Meanwhile, in the case of the constitution of the present invention, the soft magnetic free layer is formed of a laminated stack including the first soft magnetic film and the second soft magnetic film to reduce the effective amount of magnetization, and a reduction in the effective amount of magnetization of the soft magnetic free layer can be achieved by increasing the thickness of the second soft magnetic film. Although the constitution of the entire films becomes complicated, at the same time, an MR ratio is also decreased with decrease in the effective amount of magnetization. However, the decreased amount is sufficiently small compared with that of the conventional constitution. This is because, in the case of the conventional constitution, the reduction in the MR ratio is caused by an increase of inelastic scattering and a decrease in spin dependent scattering which are due to the reduction in the thickness of the soft magnetic free layer. In contrast, in the case of the present invention, the reduction in the MR ratio is caused only by an effect that a shunt loss of electric current is increased by the thickness of the second soft magnetic film. In any case, since a decrease in the effective amount of magnetization of the soft magnetic free layer causes the decrease in the MR ratio, the effective amount of magnetization should not simply be decreased to zero. The constitution of the present invention becomes effective for the first time when a sensor unit having a narrow width is formed in order that the effect of the decreasing of the anisotropic magnetic field of FIG. 5 is greater than the disadvantage of the decreasing of the MR ratio of FIG. 6, when comparing the effect of FIG. 5 with the disadvantage of FIG. 6.

Figure 7:
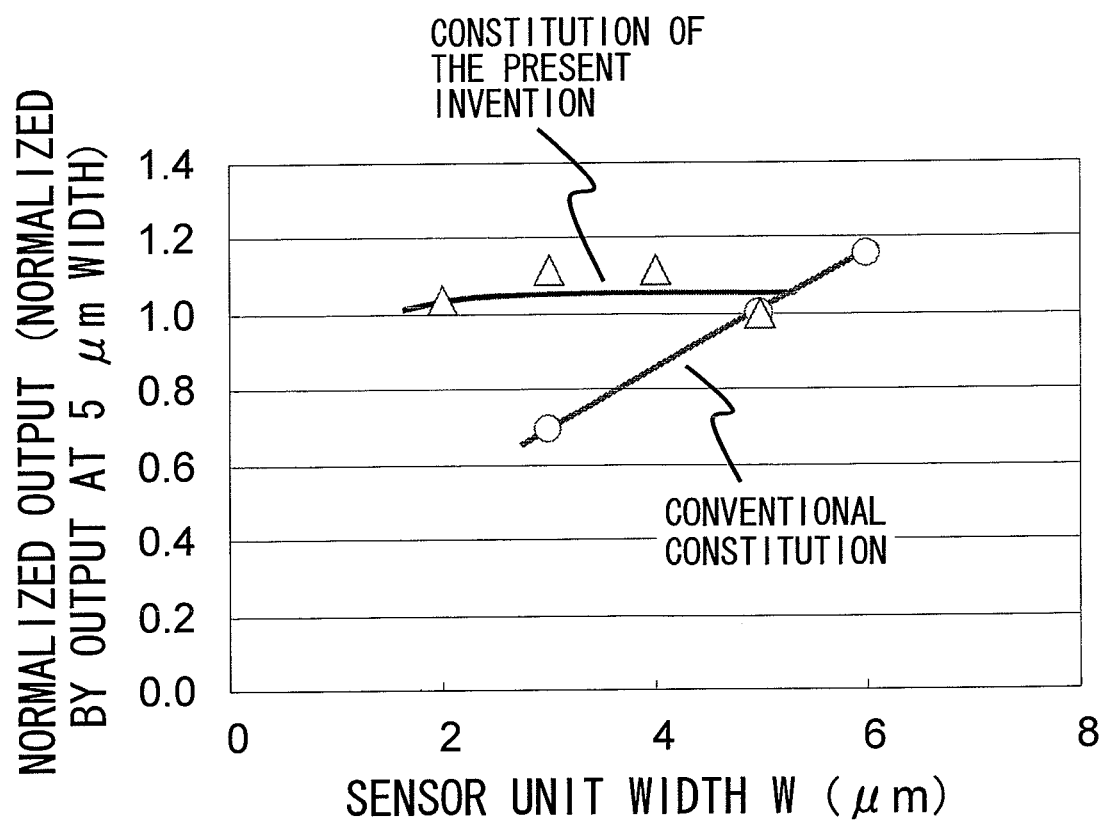
FIG. 7 is a view for showing a relationship between an output of the sensor units and a width W of the sensor units of the present invention and a conventional technique.

FIG. 7 shows a relationship between an output of the sensor unit and the width W of the sensor unit of the encoder of the constitution of the present invention. In the drawing, the output of the sensor unit is normalized by using an output when the width W of the sensor unit is 5 μm, and an output of an encoder of the conventional constitution which has a single type free layer, is also shown for comparison. Measurement was made where a magnetic gap was 15 μm. In the case of the encoder of the conventional constitution, it is seen that when the width W of the sensor unit is reduced, the output of the sensor unit decreases. This is because, when the width W of the sensor unit is reduced, the demagnetization field of the soft magnetic free layer of the magnetoresistive film is increased as described above. Consequently, the magnetic encoder of the conventional constitution was not capable of detecting a magnetic medium having magnetic recording pattern, which is narrower than 5 μm. Specifically, resolution of the magnetic encoder which can be obtained is quite limited. On the other hand, in the constitution of the present invention, even when the width W of the sensor unit is narrowed to 2 μm, an output of the sensor unit decreases very little. In the present example, although it was not possible to make a sensor unit the width of which is narrower than 2 μm, due to a limitation on a process, it can be seen that the encoder of the constitution of the present invention exerts capability in detecting a magnetic recoding pattern which is as narrow as 4 μm or below as shown in FIG. 7.

Figure 8:
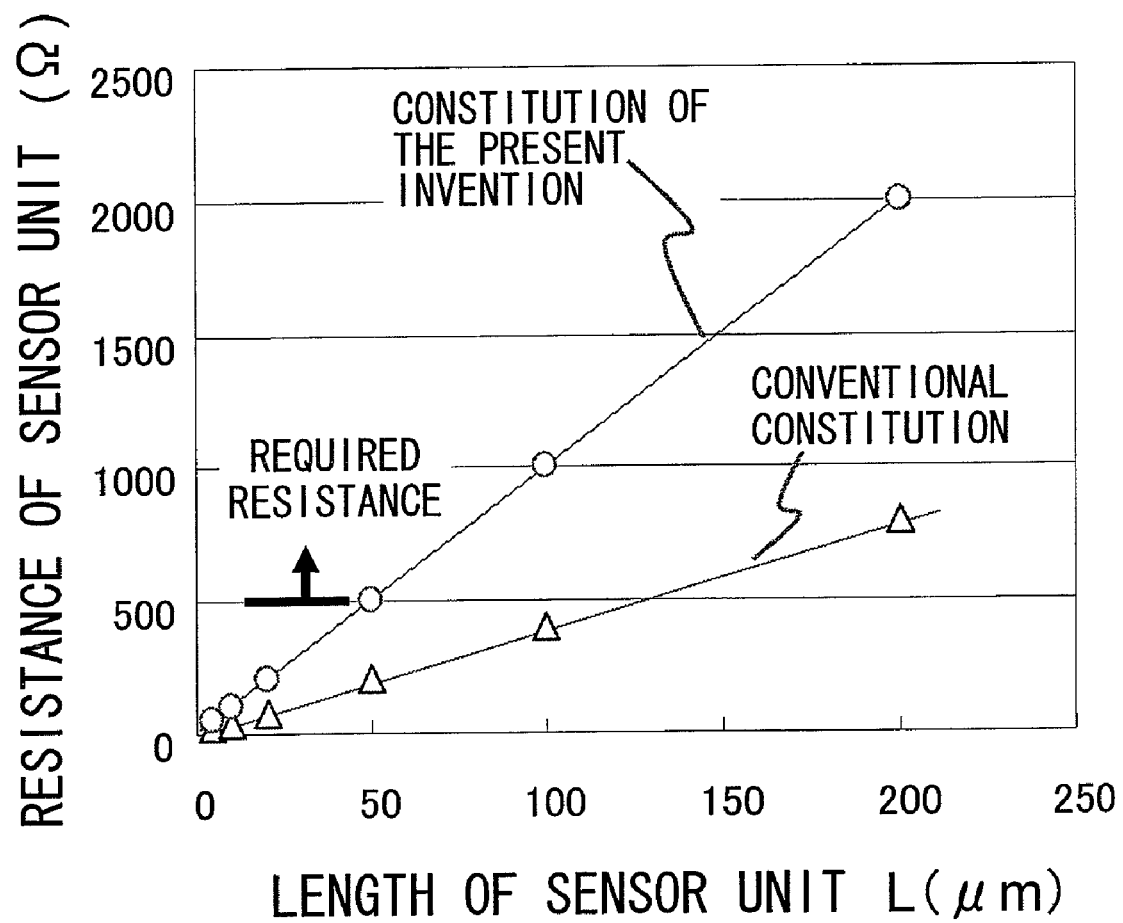
FIG. 8 is a view for showing a relationship between a length L of the sensor unit and electric resistance of the sensor unit of the encoder having the constitution of the present invention.

FIG. 8 shows a relationship between a length L of the sensor unit and electric resistance of the sensor unit of the encoder of the constitution of the present invention. The width W of the sensor unit of the constitution of the present invention is set to be 2 μm. For comparison, results are shown on the sensor unit of the conventional constitution having a single type free layer, the width of which is 5 μm. In the conventional constitution, electric resistance of the sensor unit cannot be increased so high. Even when the length of the sensor unit is set to be as large as 100 μm, the electric resistance is less than or equal to 500 Ω. When the electric resistance of the sensor unit is low, electric power consumption attributable to functioning of the encoder is increased, and practical usability of the encoder is deteriorated. The electric resistance of 500 Ω or greater is an empirical index for an electric resistance required for the sensor unit. In the conventional structure, since the width of the sensor unit is large, the electric resistance of the sensor unit is proportional to a product of the sheet resistance of a magnetoresistive film and the length of the sensor unit and inversely proportional to the width thereof. Accordingly, it is necessary to make a sensor unit so long. In contrast, it can be seen in the constitution of the present invention that the electric resistance of the sensor unit can be set to a high resistance that is 500 Ω even when the length L of the sensor unit is approximately 50 μm. According to the constitution of the present invention, even when the width W of the sensor unit is decreased to 2 μm, it is possible to maintain a magnetic sensitivity without decreasing it. Thus, with respect to the length L of the sensor unit too, a practical encoder with low electric power consumption can be realized in a wider range than that of the conventional one.

Figure 9:
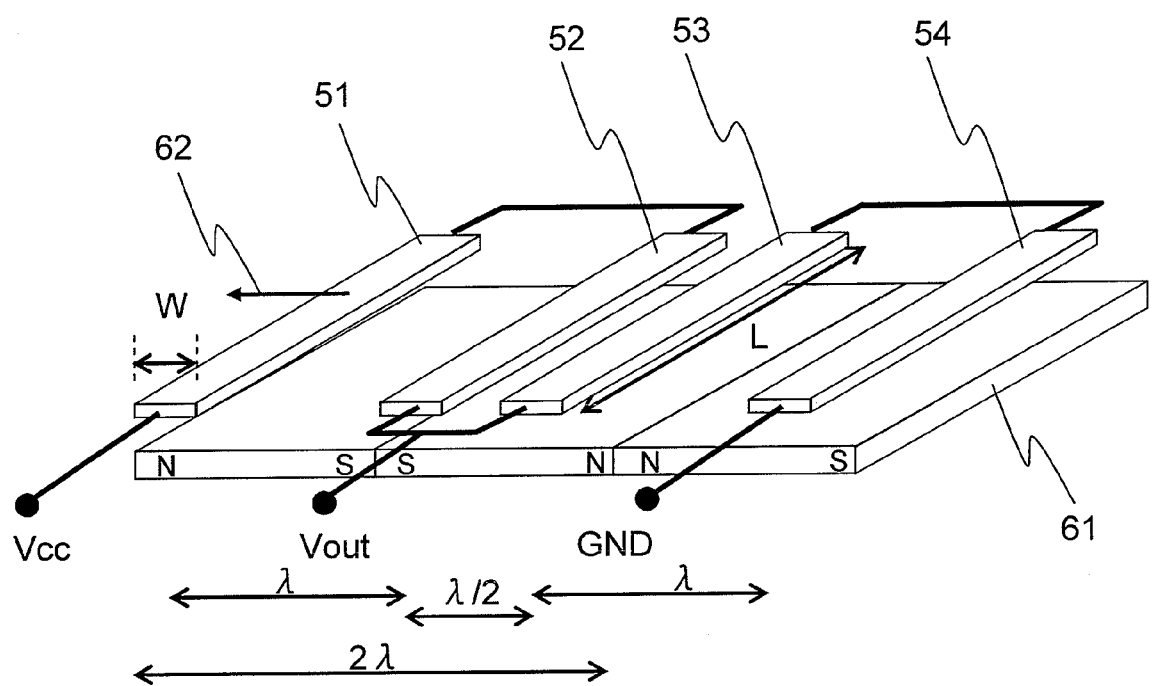
FIG. 9 is a view for showing an example of the constitution of the encoder using the magnetoresistive sensor of the magnetic encoder of the present invention.

FIG. 9 shows an example of the constitution of a sensor part of the present invention. On a magnetic medium 61, a magnetic pattern is formed repeatedly at intervals of a period 2λ. A sensor part includes four sensor units and wiring. The sensor units 51, 52, 53 and 54 are disposed in proximity to the magnetic medium 61, and function as encoders which move relatively to the magnetic medium 61. The sensor units 51, 52, 53 and 54 are disposed at suitable intervals in an arrangement direction of bits that are alternately magnetized on the magnetic medium 61. In this respect, the suitable intervals of the sensor units are basically such that the sensor units 51 and 52, as well as sensor subunits 53 and 54 are respectively disposed at an interval of approximately ½ period, i.e. λ, and that the sensor units 52 and 53 are disposed at an interval of ¼ period, i.e. λ/2. Here, mentioning on a geometrically equivalent constitution, even when relative positions between the sensor units are deviated by an integral multiple of 2λ, functions as a magnetoresistive sensor for an encoder are equivalent. This is because, since magnetic signals are written on the magnetic medium 61 at the period 2λ, an equivalent magnetic signal is sensed on a position deviated by an integral multiple of the magnetic period 2λ. However, to reduce disposition errors in the utmost simple manner can be achieved by not increasing deviations of the integral multiple of 2λ. Hence, in this example, a description of a simple constitution is given without enumerating examples on the geometrically equivalent arrangement.

The sensor units 51, 52, 53 and 54 are patterned to have a width W and a length L, and magnetizing direction of ferromagnetic pinned layers of the respective sensor units are in a magnetization pinned direction 62. To the sensor units 51, 52, 53 and 54, electrodes are connected as shown in FIG. 9, and voltages are applied, and then output voltages are detected. The widths W of the sensor units are approximately λ/4 or needs to be less than that due to a geometrical limitation. This is because, first, as is clear from FIG. 9, when the width W is large, information of magnetic bit recorded on the magnetic medium 61 is widely detected on average. Consequently, it is difficult to obtain position information of the magnetic medium 61, i.e. the function as an encoder is deteriorated. Second, this is because, since the sensor units are so disposed that they are adjacent to each other in a width direction, the widths W of the sensor units need to be approximately half of or less than half of the nearest neighbor distance between sensor units, i.e. less than or equal to λ/4 in the present example of the present invention. This is because, using a photo-lithography technique, adjacent patterns are easily formed at intervals which are approximately the same length as the width of the patterning, and because a high yield is achieved.

Figure 10:
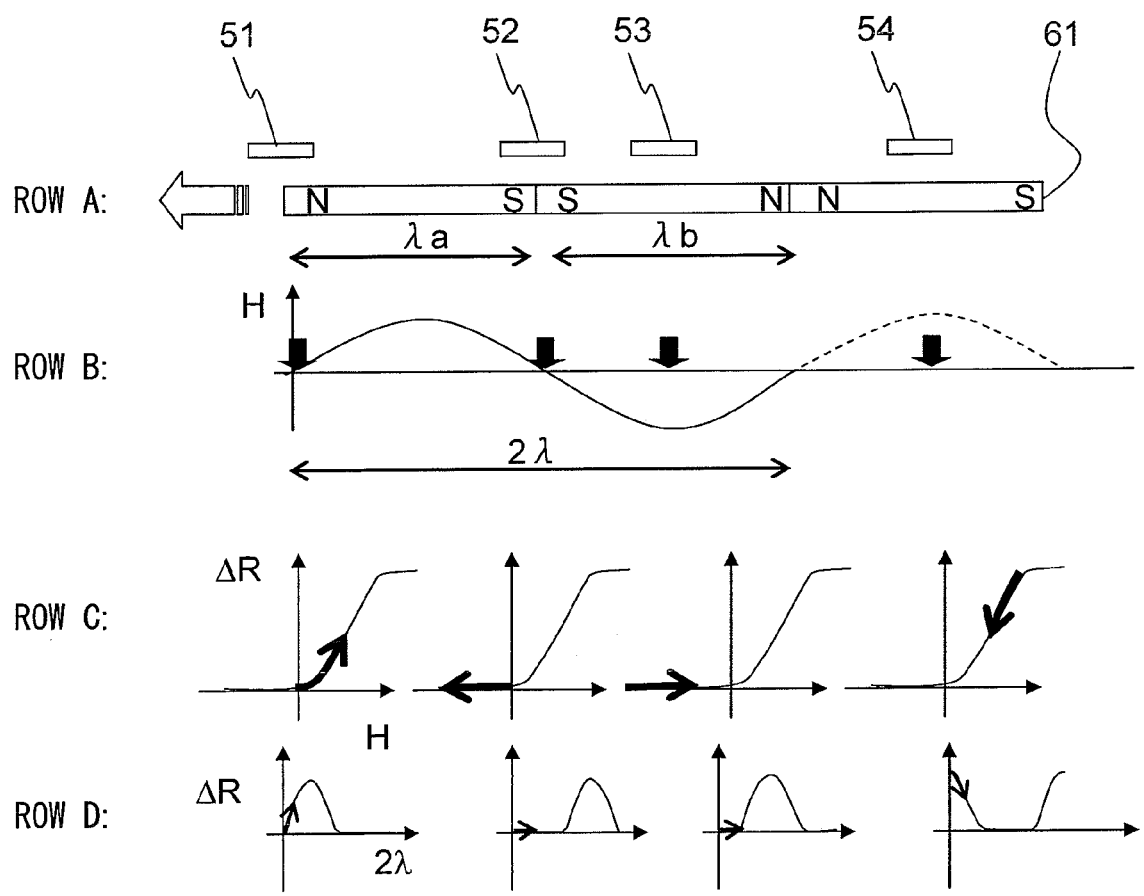
FIG. 10 is a view for showing an operation principle of the encoder using the magnetoresistive sensor of the magnetic encoder of the present invention.

FIG. 10 is a view for describing an operation principle of the magnetoresistive sensor of the magnetic encoder of the present invention. The row A of FIG. 10 is a schematic view of an encoder using the magnetoresistive sensor and the magnetic medium of the present invention. The sensor units 51, 52, 53 and 54 face to and move relative to the magnetic medium 61. Magnetic fields sensed by the respective sensor units are shown on the row B of FIG. 10. When the magnetic medium 61 is on a relative position shown on the row A of FIG. 10, magnetic fields to be sensed by the sensor units 51, 52, 53 and 54 start from those indicated by black arrows corresponding thereto as shown on the row B of FIG. 10, and the magnetic fields to be sensed change as the magnetic medium moves.

The row C of FIG. 10 is a schematic view for showing responses of the respective sensor units to the magnetic fields, the responses thereof corresponding to, from left, the sensor units 51, 52, 53 and 54. Describing in detail using the first sensor unit 51 as an example, when the magnetic medium 61 moves in a direction indicated by a white arrow on the row A, the magnetic field sensed by a first sensor unit 51 is increased from zero to positive. At this time, as shown by a drawing on the left side of the row C, a magnetic field response curve of the first sensor unit 51 shows a increase ΔR in resistance as shown by the thick arrow in the drawing, when the magnetic field increases. On the other hand, the magnetic field in a magnetic field response curve of a second sensor unit 52 changes from zero to negative. Consequently, a resistance change ΔR is zero. As described above, from the properly arranged sensor units, changes in resistance are detected according to respective locations. However, when the magnetic medium 61 moves by one magnetic period, i.e. 2λ, the sensor units cause an increase or a decrease in resistance to occur, showing changes in resistance as shown on the row D of FIG. 10. In this respect, 2λ is defined such that 2λ=λa+λb where λa and λb are respective lengths of magnetic signals which are recorded on the magnetic medium 61 in opposite directions alternately. The encoder using the magnetoresistive sensor of the present invention operates by compositing the wave forms.

Figure 11:
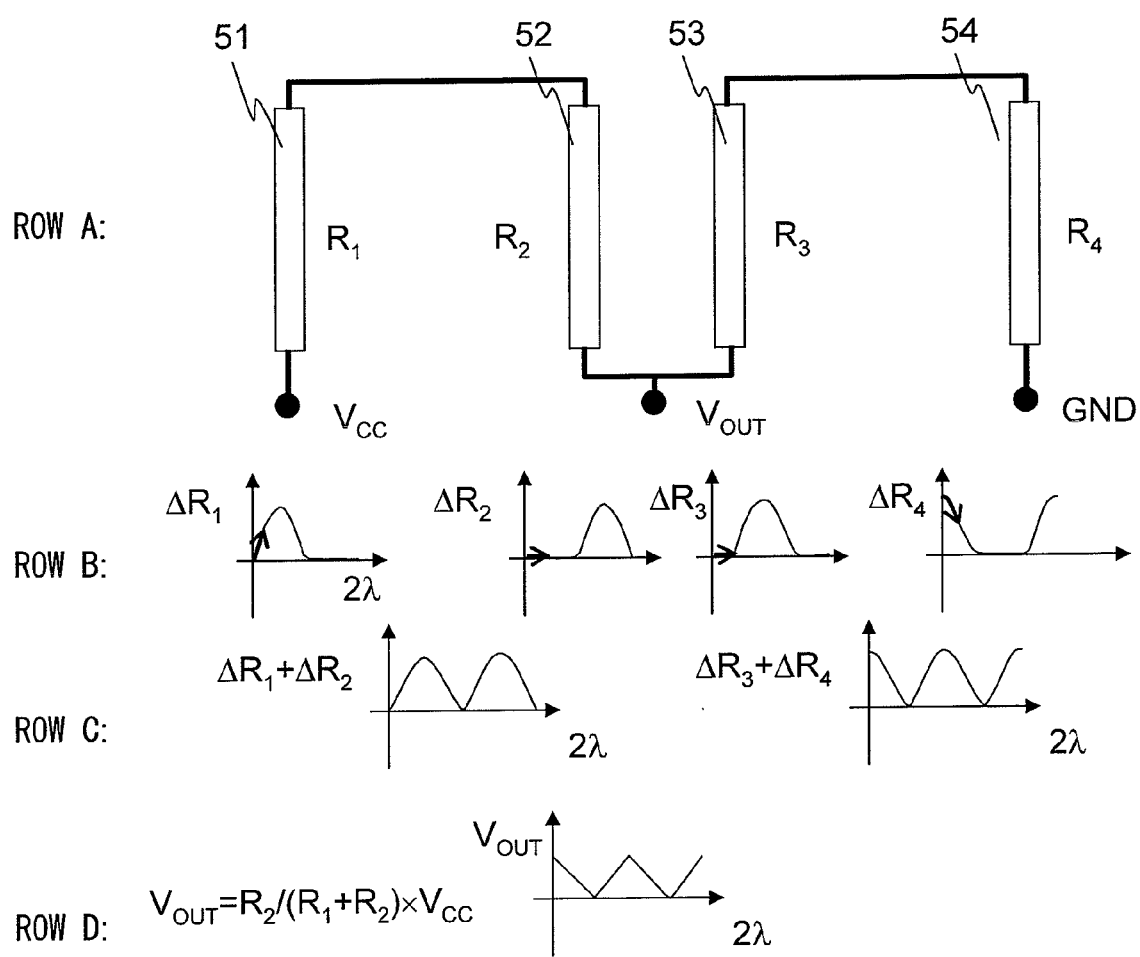
FIG. 11 is a view for showing an operation principle of a magnetoresistive sensor circuit of the encoder of the present invention.

FIG. 11 shows an example of a circuit of the magnetoresistive sensor of the present invention and an operation principle of the circuit. The row A of FIG. 11 is a view for showing a bridge circuit of the magnetoresistive sensor of the present invention. The sensor units 51, 52, 53 and 54 respectively have electric resistances R1, R2, R3 and R4. A first sensor unit 51 and a second sensor unit 52 are electrically connected in serial and, in the same manner, a third sensor unit 53 and a fourth sensor unit 54 are also electrically connected in serial. The start point of the first sensor unit 51 is connected to an applied electric voltage Vcc, and the end point of the fourth sensor unit 54 is connected to the ground of the circuit, whereby an electric voltage $V_{out}$ of a connecting part on a middle connected point between the second and third sensor units 52 and 53 is taken out as a signal.

In the same description as that for FIG. 10, an operation principle of the magnetoresistive sensor of the present invention is described below. The row B of FIG. 11 being similar to the row D of FIG. 10 shows magnetic field response curves of the respective sensor units for one period. As shown on the row C of FIG. 11, magnetic field response curves of the first and second sensor units connected in serial with each other can be a sum of the magnetic field response curves of the first and second sensor units. The same description can be given to the third and fourth sensor units, as well. However, as shown in FIG. 9, the third and fourth sensor units are disposed on a position on which they are shifted to the first and second sensor units by ½×λ, whereby response curves on the row C of FIG. 11 becomes one whose phase is shifted by ½×λ period. The row D of FIG. 11 is a view for showing a middle point voltage $V_{out}$. A bridge circuit for the first and second sensor units and the third and fourth sensor units is formed to detect the middle point voltage. Thereby, the magnetoresistive sensor for an encoder of the present invention shows favorable characteristics that it can obtain a detection signal for two periods within one magnetic period of 2λ.

Figure 12:
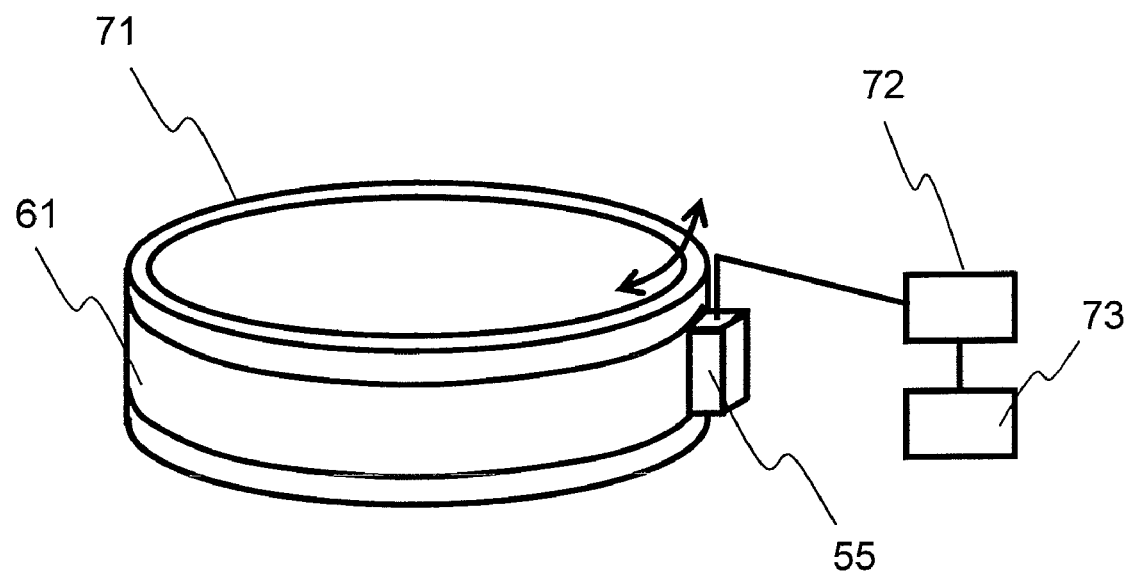
FIG. 12 is a view for showing an example of a constitution of the encoder of the present invention.

FIG. 12 shows an example of a constitution of the encoder of the present invention. A driver 71 moves relative to a sensor 55, for example, rotates in a direction of an arrow indicated in the drawing. On the driver 71, the magnetic medium 61 is disposed, on which magnetic signals are written at suitable pitches. The sensor 55 is disposed in proximity to the magnetic medium 61 on the driver 71 with a suitable gap interposed therebetween. An AD converter 72 and a computing device 73 process signals from the sensor 55 to generate outputs which are converted into signals by the encoder.

As a result of making the sensor for a encoder according to the above-described constitution, the magnetoresistive sensor which is formed of the narrow sensor units each having a synthetic ferr-magnet type soft magnetic free layer of the present invention, showed a favorable output in a wide range of a magnetic gap between the sensor and the magnetic medium, a magnetic pitch thereof being 10 μm.

Although the encoder exemplified in FIG. 12 is one formed by disposing the magnetic medium on the outer circumference of a disk-like driver, a sensor into which sensor units of the present invention are integrated is applicable to an encoder formed by disposing a magnetic medium on a surface of the disk. Furthermore, a sensor into which sensor units of the present invention are integrated, is also applicable to an encoder formed by disposing a magnetic medium on a flat surface being linear as in the case of a magnetic scale. For the magnetic medium, a not-composite permanent magnet, and composite of powder of permanent magnet, resin and the like can be used.

According to the present invention, it is possible to realize a magnetic sensor, especially one for an encoder, which has the narrower width of sensor units, more precisely, the width of not greater than 4 μm, and which has a reduced demagnetization field. By using this for an encoder, it is possible to achieve a highly accurate position and rotation control with high sensitivity and high resolution.

What is claimed is:
1. A magnetic encoder, comprising:
a magnetic medium on which an area with the width of λa magnetized in a first direction and an area with the width of λb magnetized in a second direction are alternately disposed; and
a magnetoresistive sensor formed by arranging a plurality of sensor units at intervals in a width direction of the area, each of the sensor units being formed of a magnetoresistive film patterned into a strip-like shape, the magnetoresistive film having a structure in which a soft magnetic free layer, a non-magnetic intermediate layer and a ferromagnetic pinned layer are stacked, a magne- tization direction of the soft magnetic free layer changing in response to an external magnetic field, wherein the soft magnetic free layer of the sensor units has a structure in which a first soft magnetic film, an anti-parallel coupling film and a second soft magnetic film are stacked in sequential order from a side of the non-magnetic intermediate layer; and magnetizations of the first soft magnetic film and the second soft magnetic film are magnetically coupled to each other in anti-parallel directions, and the magnetic encoder outputs an electric signal having a period of $\lambda=(\lambda a+\lambda b)/2$.

2. The magnetic encoder according to claim 1, wherein the magnetoresistive film has an antiferromagnetic film which applies an exchange coupling magnetic field substantially pinning magnetization of the ferromagnetic pinned layer.

3. The magnetic encoder according to claim 1, wherein the following equations are satisfied:

$$M1>M2;$$

and $$1(nm\cdot T)<M1-M2<3(nm\cdot T)$$

where M1 denotes a product of saturation magnetization and a thickness of the first soft magnetic film, and M2 denotes a product of saturation magnetization and a thickness of the second soft magnetic film.

4. The magnetic encoder according to claim 1, wherein the magnetoresistive film has the width of 4 μm or less and the length of 50 μm or longer.

5. The magnetic encoder according to claim 1, wherein the magnetoresistive sensor has a first sensor unit; a second sensor unit disposed apart from the first sensor unit in a width direction by (2n-1) λ, where n denotes a positive integer; a third sensor unit disposed apart from the second sensor unit in the width direction by (2n-1) λ/2; and a fourth sensor unit disposed apart from the third sensor unit in the width direction by (2n-1) λ;

and the first, second, third and fourth sensor units form a bridge circuit.

6. The magnetic encoder according to claim 5, wherein a power terminal, the first sensor unit and the second sensor unit which are electrically coupled in serial, a middle connected point, the third sensor unit and the fourth sensor unit which are electrically connected in serial, and a ground part are electrically coupled in sequential order; and a middle point voltage of the middle connected point is detected.

7. The magnetic encoder according to claim 1, wherein the λ is 10 μm or less.

* * * * *